(12) United States Patent
Hsiao

(10) Patent No.: US 10,409,099 B2
(45) Date of Patent: Sep. 10, 2019

(54) HIGH SCREEN RATIO DISPLAY DEVICE WITH FINGERPRINT IDENTIFICATION

(71) Applicant: FocalTech Electronics, Ltd, Grand Cayman (KY)

(72) Inventor: Pei-Hung Hsiao, Hsinchu (TW)

(73) Assignee: FOCALTECH ELECTRONICS, LTD., Grand Cayman (KY)

(*) Notice: Subject to any disclaimer, the term of this patent is extended or adjusted under 35 U.S.C. 154(b) by 148 days.

(21) Appl. No.: 15/685,691

(22) Filed: Aug. 24, 2017

(65) Prior Publication Data

US 2019/0004354 A1    Jan. 3, 2019

(30) Foreign Application Priority Data

Jul. 3, 2017   (TW) .............................. 106122230 A

(51) Int. Cl.
| | |
|---|---|
| *G06F 3/041* | (2006.01) |
| *G02F 1/1333* | (2006.01) |
| *G06K 9/00* | (2006.01) |
| *H01L 27/32* | (2006.01) |

(52) U.S. Cl.
CPC ........ *G02F 1/13338* (2013.01); *G06F 3/0414* (2013.01); *G06K 9/0004* (2013.01); *G06K 9/00053* (2013.01); *G06K 9/00087* (2013.01); *H01L 27/3248* (2013.01); *G06F 2203/04105* (2013.01)

(58) Field of Classification Search
CPC ............ G02F 1/13338; G06K 9/00053; G06K 9/0004; G06K 9/00087; G06F 3/0414; G06F 2203/04105; H01L 27/3248
See application file for complete search history.

(56) References Cited

U.S. PATENT DOCUMENTS

| | | | | |
|---|---|---|---|---|
| 9,298,317 | B2* | 3/2016 | Chou ................. | G06K 9/00026 |
| 9,383,845 | B2* | 7/2016 | Yoshiyama ............. | G06F 3/041 |
| 9,652,066 | B2* | 5/2017 | Setlak .................... | G06F 3/0412 |
| 9,870,033 | B1* | 1/2018 | Browning ............ | H03K 17/975 |
| 9,886,613 | B2* | 2/2018 | Pi .......................... | G06F 1/1626 |
| 9,959,444 | B2* | 5/2018 | Young ................ | G06K 9/00013 |
| 10,108,839 | B2* | 10/2018 | Uehara ................... | G06F 3/041 |
| 10,139,938 | B2* | 11/2018 | Deng ................. | A61B 5/02438 |
| 2002/0163601 | A1* | 11/2002 | Min, II ............... | G02F 1/13338 |
| | | | | 349/33 |
| 2003/0156743 | A1* | 8/2003 | Okada ................. | G06K 9/0002 |
| | | | | 382/124 |

(Continued)

*Primary Examiner* — Jose R Soto Lopez
(74) *Attorney, Agent, or Firm* — Muncy, Geissler, Olds & Lowe, P.C.

(57) ABSTRACT

A high screen ratio display device with fingerprint identification includes a lower substrate, an upper substrate, and a cover glass. The lower substrate has a thin film transistor array formed with a plurality of thin film transistors and corresponding capacitors to provide an active area. The upper substrate is disposed on one side of the TFT array, and has an optical film layer. The cover glass is disposed on one side of the upper substrate, and has an opening to accommodate a fingerprint identification module. The opening at least partially overlaps the active area, and a space is defined between the opening of the cover glass and the thin film transistor array to accommodate a portion of the fingerprint identification module.

12 Claims, 10 Drawing Sheets

(56) References Cited

U.S. PATENT DOCUMENTS

| | | | |
|---|---|---|---|
| 2003/0215976 A1* | 11/2003 | Chou | G06K 9/0002 438/57 |
| 2011/0102567 A1* | 5/2011 | Erhart | G06K 9/00026 348/77 |
| 2011/0267298 A1* | 11/2011 | Erhart | G06F 1/1626 345/173 |
| 2012/0092350 A1* | 4/2012 | Ganapathi | G02B 26/0833 345/501 |
| 2012/0242635 A1* | 9/2012 | Erhart | G06F 1/1626 345/207 |
| 2014/0028616 A1* | 1/2014 | Furutani | G06F 3/044 345/174 |
| 2014/0146033 A1* | 5/2014 | Koyama | G09G 3/3655 345/212 |
| 2014/0341448 A1* | 11/2014 | Chiu | G06K 9/0002 382/124 |
| 2015/0071502 A1* | 3/2015 | Breznicky | G06K 9/00885 382/115 |
| 2015/0071508 A1* | 3/2015 | Boshra | G06K 9/00013 382/124 |
| 2016/0070404 A1* | 3/2016 | Kerr | G06F 3/0418 345/174 |
| 2016/0077622 A1* | 3/2016 | Lee | G06F 1/1626 345/173 |
| 2016/0140379 A1* | 5/2016 | Pedersen | G06K 9/00919 726/19 |
| 2016/0357294 A1* | 12/2016 | Ozeki | C03C 15/00 |
| 2016/0364072 A1* | 12/2016 | Chiang | G06F 3/0416 |
| 2017/0040553 A1* | 2/2017 | Watabe | H01L 51/0085 |
| 2017/0103251 A1* | 4/2017 | Liu | G06K 9/00087 |
| 2017/0124370 A1* | 5/2017 | He | G06K 9/0012 |
| 2017/0124372 A1* | 5/2017 | Evans, V | G06F 1/1684 |
| 2017/0212618 A1* | 7/2017 | Teranishi | G06F 3/044 |
| 2017/0364726 A1* | 12/2017 | Buchan | G01N 29/2437 |
| 2018/0025202 A1* | 1/2018 | Ryshtun | G06K 9/0012 382/124 |
| 2018/0039815 A1* | 2/2018 | Jung | G06K 9/00013 |
| 2018/0046281 A1* | 2/2018 | Pi | A61B 5/02416 |
| 2018/0046297 A1* | 2/2018 | Weng | G02F 1/13338 |
| 2018/0081480 A1* | 3/2018 | Ran | G06F 3/0414 |
| 2018/0088712 A1* | 3/2018 | Kim | G02F 1/13338 |
| 2018/0089485 A1* | 3/2018 | Bok | G06K 9/0002 |
| 2018/0089492 A1* | 3/2018 | Cai | H04M 1/026 |
| 2018/0101711 A1* | 4/2018 | D'Souza | G06F 21/32 |
| 2018/0113541 A1* | 4/2018 | Xie | G02F 1/1343 |
| 2018/0121067 A1* | 5/2018 | Lee | G06F 3/04842 |
| 2018/0129106 A1* | 5/2018 | Gao | G02F 1/134363 |
| 2018/0129798 A1* | 5/2018 | He | G06K 9/00013 |
| 2018/0130857 A1* | 5/2018 | Lee | H01L 27/3234 |
| 2018/0151641 A1* | 5/2018 | Choo | H04M 1/0266 |
| 2018/0157411 A1* | 6/2018 | Kim | G06K 9/0004 |
| 2018/0157889 A1* | 6/2018 | MacDonald | H01L 27/3227 |
| 2018/0160545 A1* | 6/2018 | Kim | G02F 1/1333 |
| 2018/0166017 A1* | 6/2018 | Li | G09G 3/3233 |
| 2018/0190190 A1* | 7/2018 | Xi | G09G 3/3225 |
| 2018/0191878 A1* | 7/2018 | Lu | G06F 1/1684 |
| 2018/0217854 A1* | 8/2018 | Lee | G06F 9/451 |
| 2018/0232091 A1* | 8/2018 | Owada | G06F 3/0414 |
| 2018/0260602 A1* | 9/2018 | He | G06K 9/0008 |
| 2018/0315357 A1* | 11/2018 | Nam | G09F 13/22 |
| 2018/0336331 A1* | 11/2018 | Liau | G06F 1/1626 |
| 2018/0341290 A1* | 11/2018 | Sim | G06F 1/1643 |
| 2018/0365466 A1* | 12/2018 | Shim | G06F 3/0421 |
| 2018/0373913 A1* | 12/2018 | Panchawagh | G06K 9/0002 |
| 2019/0019850 A1* | 1/2019 | Xu | G06K 9/0004 |
| 2019/0057243 A1* | 2/2019 | Liu | G06K 9/00 |
| 2019/0065809 A1* | 2/2019 | Li | G06F 3/0421 |
| 2019/0073507 A1* | 3/2019 | D'Souza | G06F 21/32 |

* cited by examiner

HIGH SCREEN RATIO DISPLAY DEVICE WITH FINGERPRINT IDENTIFICATION

BACKGROUND OF THE INVENTION

1. Field of the Invention

The present disclosure relates to the technical field of display devices and, more particularly, to a high screen ratio display device with fingerprint identification.

2. Description of Related Art

Nowadays, the development trend of mobile phones is moving toward having a high screen ratio, which is from the previous screen ratio of 4 to 3 to the current screen ratio of 16 to 9. For example, the S8 mobile phone sold by Samsung Electronics Inc. has a panel of 5.8 inches and a screen ratio of 18.5 to 9. To obtain a higher screen ratio, the fingerprint identification module is typically designed on the back side of the mobile phone so as not to occupy the front screen of the panel.

FIG. 1 is a schematic diagram of a prior mobile phone. As shown, the fingerprint identification module 110 is placed on the back side of the mobile phone 100 and beside the camera module 120. Users have to use their fingers to touch the fingerprint identification module 110 and then trigger the fingerprint identification. However, as being just beside the finger identification, the camera module 120 is often inadvertently touched at this moment and thus is likely to be stained by the fingers. Therefore, it is inconvenient for users to perform fingerprint identification in certain usage situations in case of placing the fingerprint identification module 110 on the back side of the mobile phone 100. Accordingly, it is desirable to provide a high screen ratio display device with fingerprint identification to mitigate and/or obviate the aforementioned problems.

SUMMARY OF THE INVENTION

The object of the present disclosure is to provide a high screen ratio display device with fingerprint identification, in which an active area of the display device can be further extended downwardly so as to increase the screen ratio, whereby the screen ratio of the display device can be easily increased to exceed a ratio of 16 to 9. Furthermore, by disposing a plurality of sensing electrodes in an area of a thin film transistor array that corresponds to an opening, the display device can be provided with a function of force sensing.

To achieve the object, there is provided a high screen ratio display device with fingerprint identification, which includes: a lower substrate, an upper substrate, and a cover glass. The lower substrate has a thin film transistor array formed with a plurality of thin film transistors and corresponding capacitors to provide an active area. The upper substrate is disposed on one side of the thin film transistor array and has an optical film layer. The cover glass is disposed on one side of the upper substrate and has an opening to accommodate a fingerprint identification module. The opening at least partially overlaps the active area, and a space is defined between the opening and the thin film transistor array to accommodate a portion of the fingerprint identification module.

Other objects, advantages, and novel features of the present disclosure will become more apparent from the following detailed description when taken in conjunction with the accompanying drawings.

DETAILED DESCRIPTION OF THE PREFERRED EMBODIMENT

The present disclosure will now be described in further detail with reference to the accompanying drawings and the accompanying embodiments, in which the objects, technologies and advantages of the present disclosure will become more clearly apparent. It is to be understood that the specific embodiments described herein are for illustrative purpose and are not intended to limit the disclosure.

Figure 1:
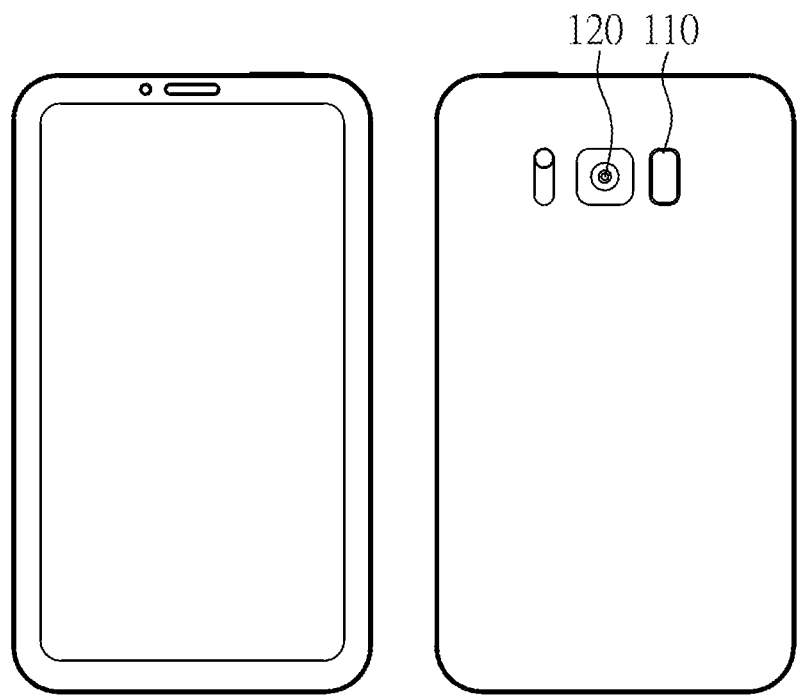
FIG. 1 is a schematic diagram of a prior mobile phone.
Figure 2A:
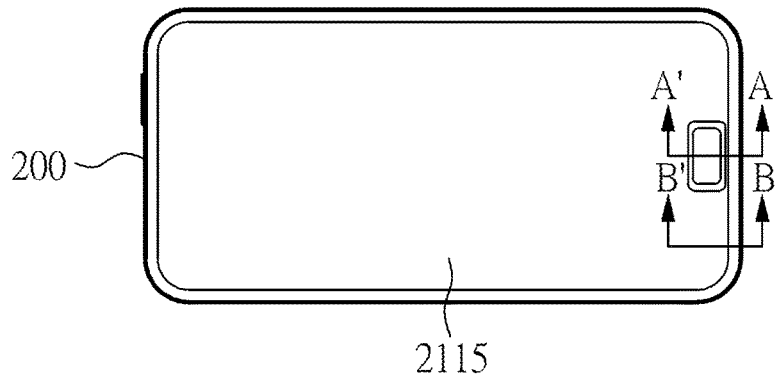
FIG. 2(A) is a schematic diagram of a high screen ratio display device with fingerprint identification in accordance with a first embodiment of the present disclosure.
Figure 2B:
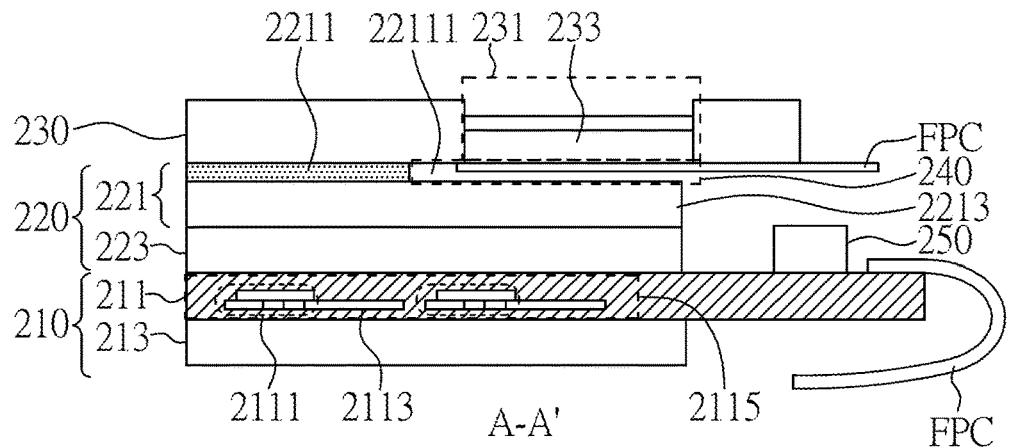
FIG. 2(B) is a cross-sectional view of the display device taken along the A-A' line in FIG. 2(A)
Figure 2C:
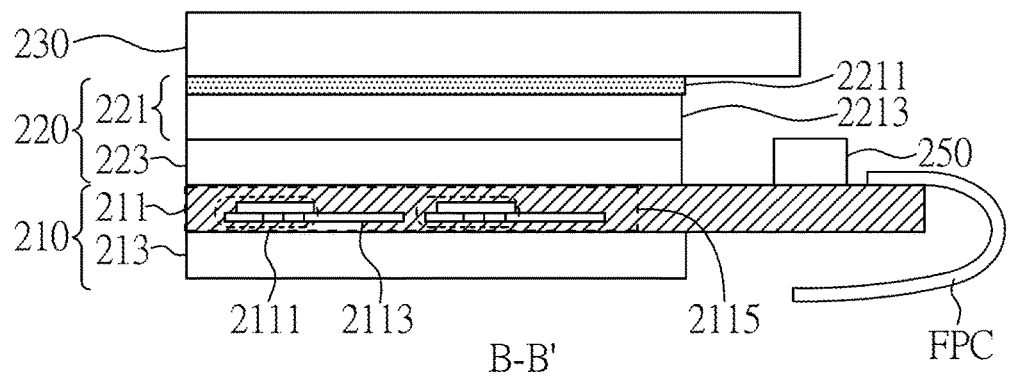
FIG. 2(C) is a cross-sectional view of the display device taken along the B-B' line in FIG. 2(A)

FIG. 2(A) is a schematic diagram of a high screen ratio display device with fingerprint identification in accordance with a first embodiment of the present disclosure. FIG. 2(B) is a cross-sectional view of the display device taken along the A-A' line in FIG. 2(A). FIG. 2(C) is a cross-sectional view of the display device taken along the B-B' line in FIG. 2(A). As shown, the high screen ratio display device 200 includes a lower substrate 210, an upper substrate 220 and a cover glass 230.

The lower substrate 210 has a thin film transistor array 211 and a lower polarizer 213. The thin film transistor array 211 is formed with a plurality of thin film transistors 2111 and corresponding capacitors 2113, by which an active area 2115 is provided on the thin film transistor array 211.

The upper substrate 220 is disposed on one side of the thin film transistor array 211. The upper substrate 220 includes an optical film layer 221 and a color filter layer 223. The optical film layer 221 includes an optical clear adhesive layer 2211 and a polarizer layer 2213.

The cover glass 230 is disposed on one side of the upper substrate 220. The cover glass 230 has an opening 231 to accommodate a fingerprint identification module 233. The opening 231 of the cover glass 230 at least partially overlaps the active area 215, and there is a space 240 defined between the opening 231 of the cover glass 230 and the thin film transistor array 211 to accommodate a portion of the fingerprint identification module 233. In this embodiment, the opening 231 of the cover glass 230 is disposed entirely within a range corresponding to the active area 215. In other embodiments, the opening 231 at least partially overlaps the active area 215, and the fingerprint identification module 233 accommodated in the opening 231 also at least partially overlaps the active area 215.

As shown in FIG. 2(B), the optical adhesive layer 2211 has a gap 22111 corresponding to the opening 231 to define the space 240. As shown, the space 240 can accommodate a flexible circuit board (not shown) of the fingerprint identification module 233 to transmit the signals of the fingerprint identification module 233.

As shown in FIG. 2(B) and FIG. 2(C), a display driving and touch detection integrated circuit 250 is disposed on the thin film transistor array. The display driving and touch detection integrated circuit 250 is electrically connected to the thin film transistor array 211 by using a chip on glass (COG) technology or a chip on film (COF) technology, so as to drive a display screen for performing display operation and touch detection operation.

Furthermore, as shown in FIG. 2(B) and FIG. 2(C), in the cross-sectional view of the display device 200 taken along the A-A' line, the opening 231 of the cover plate 230 and the space 240 can be seen. However, in the cross-sectional view of the display device 200 taken along the B-B' line, none of the opening 231 of the cover plate 230 and the space 240 can be seen. That is, with the present disclosure, the active area 2115 of the display device 200 can be extended to the area of the cross-sectional line B-B', thereby dramatically increasing the screen ratio (screen aspect ratio). Accordingly, the screen ratio of the display device 200 can be greater than a ratio of 16 to 9.

Figure 3:
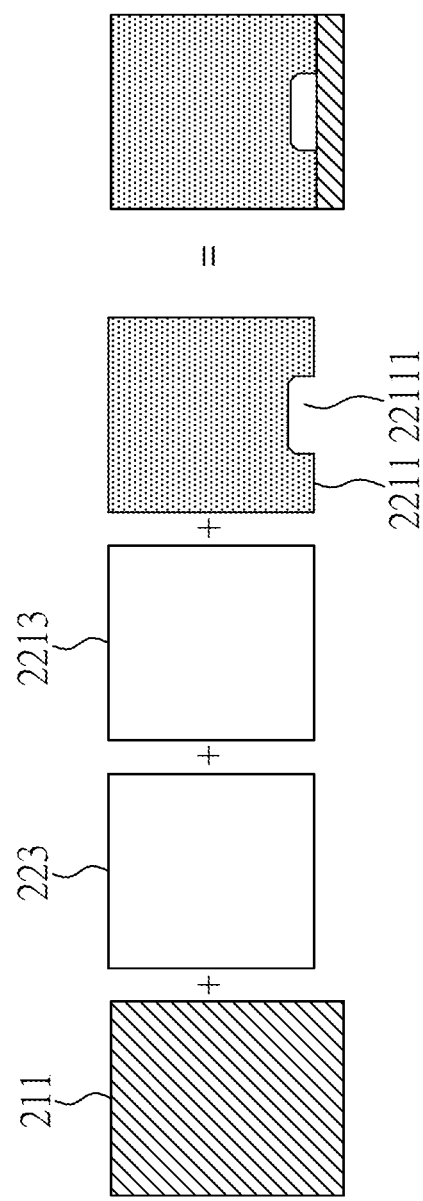
FIG. 3 schematically illustrates the thin film transistor array, color filter layer, polarizer layer and optical clear adhesive layer of the display device in accordance with the first embodiment of the present disclosure.

FIG. 3 schematically illustrates the thin film transistor array, color filter layer, polarizer layer and optical clear adhesive (OCA) layer of the display device in accordance with the first embodiment of the present disclosure. As shown, the OCA layer 2211 has a gap 22111 to define the space 240. Accordingly, in comparison with the prior art, the active area 2115 of the present disclosure can be extended downward to the left and right sides of the gap 22111, thereby increasing the screen ratio of the display screen.

Figure 4A:
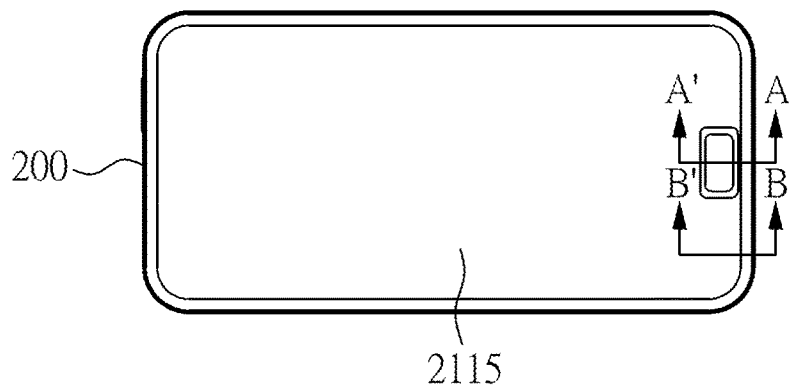
FIG. 4(A) is a schematic diagram of a high screen ratio display device with fingerprint identification in accordance with a second embodiment of the present disclosure.
Figure 4B:
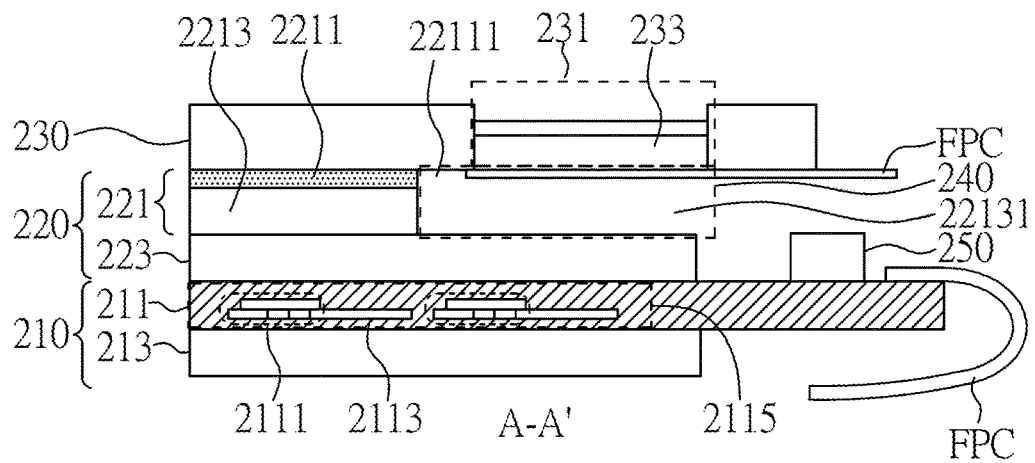
FIG. 4(B) is a cross-sectional view of the display device taken along the A-A' line in FIG. 4(A)
Figure 4C:
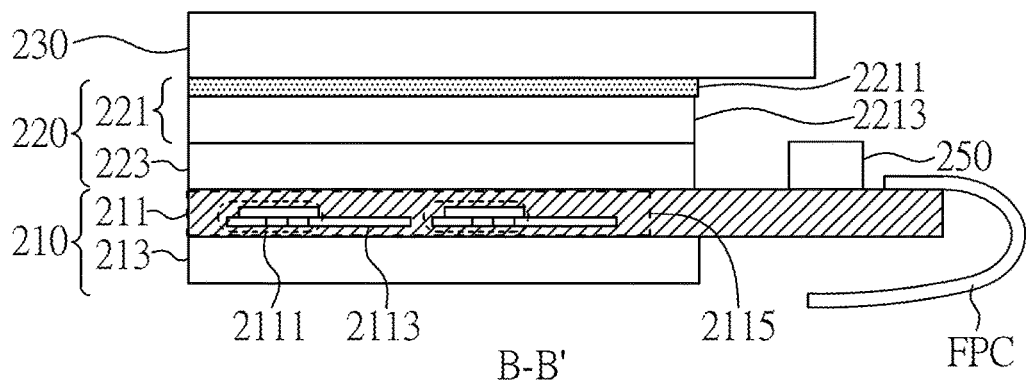
FIG. 4(C) is a cross-sectional view of the display device taken along the B-B' line in FIG. 4(A)

FIG. 4(A) is a schematic diagram of a high screen ratio display device with fingerprint identification in accordance with a second embodiment of the present disclosure. FIG. 4(B) is a cross-sectional view of the display device taken along the A-A' line in FIG. 4(A). FIG. 4(C) is a cross-sectional view of the display device taken along the B-B' line in FIG. 4(A). As shown, FIGS. 4(A) to 4(C) are similar to FIGS. 2(A) to 2(C) except that the polarizer layer 2213 has a gap 22131 corresponding to the opening 231, so as to define the space 240 in combination with the gap 22111. The gap 22131 is corresponding to the gap 22111; i.e., the position and size of the gap 22131 is the same as those of the gap 22111, while the gap 22131 is located in the polarizer layer 2213 and the gap 22111 is located in the OCA layer 2211.

Figure 4D:
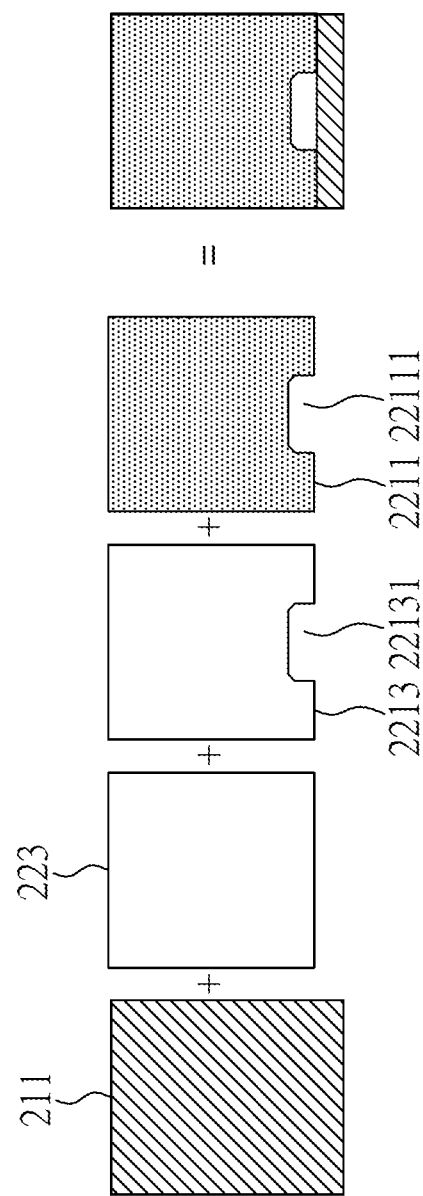
FIG. 4(D) schematically illustrates the thin film transistor array, color filter layer, polarizer layer and optical clear adhesive layer of the display device in accordance with the second embodiment of the present disclosure.

FIG. 4(D) schematically illustrates the thin film transistor array, the color filter layer, the polarizer layer and the OCA layer of the display device in accordance with the second embodiment of the present disclosure. As shown, FIG. 4(D) is similar to FIG. 3 except that the polarizer layer 2213 and the OCA layer 2211 are respectively provided with gaps 22131 and 22111 corresponding to the opening 231 to define the space 240.

Figure 5A:
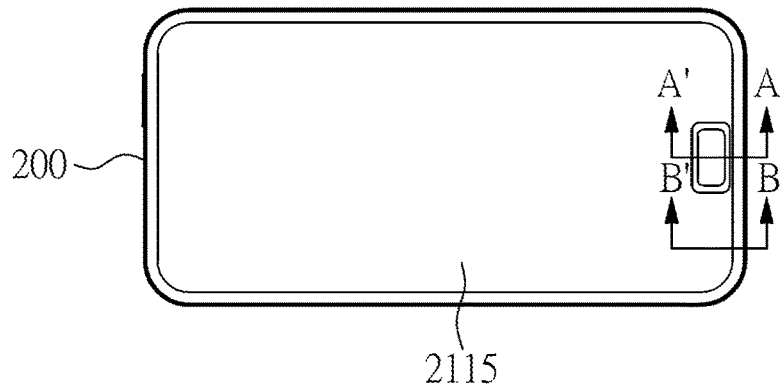
FIG. 5(A) is a schematic diagram of a high screen ratio display device with fingerprint identification in accordance with a third embodiment of the present disclosure.
Figure 5B:
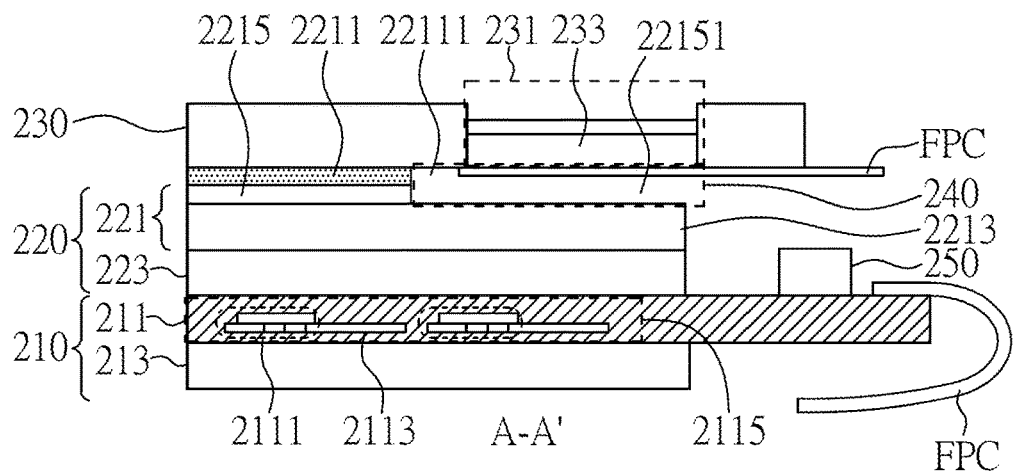
FIG. 5(B) is a cross-sectional view of the display device taken along the A-A' line in FIG. 5(A)
Figure 5C:
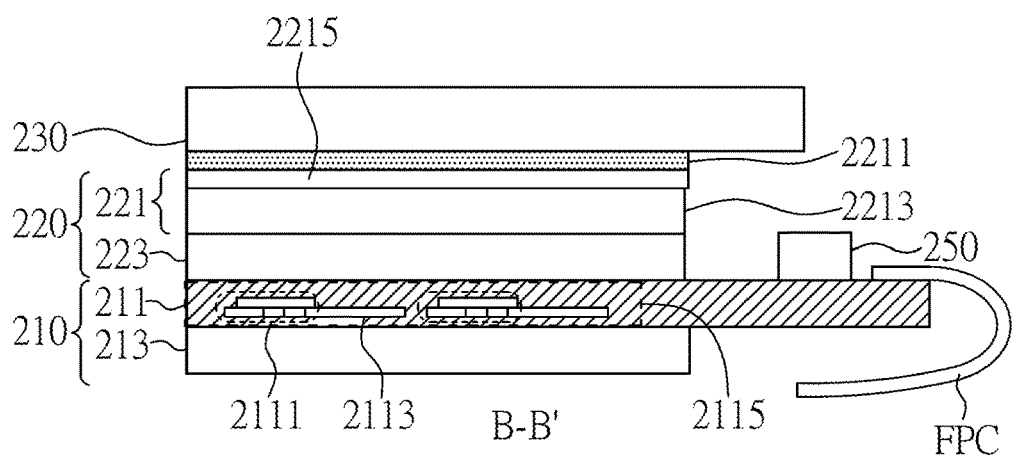
FIG. 5(C) is a cross-sectional view of the display device taken along the B-B' line in FIG. 5(A)

FIG. 5(A) is a schematic diagram of a high screen ratio display device with fingerprint identification in accordance with a third embodiment of the present disclosure. FIG. 5(B) is a cross-sectional view of the display device taken along the A-A' line in FIG. 5(A). FIG. 5(C) is a cross-sectional view of the display device taken along the B-B' line in FIG. 5(A). As shown, FIGS. 5(A) to 5(C) are similar to FIGS. 2(A) to 2(C) except that the optical film layer 221 further includes a pad material layer 2215 having a gap 22151 corresponding to the opening 231, so as to define the space 240 in combination with the gap 22111. The gap 22151 is corresponding to the gap 22111; i.e., the position and size of the gap 22151 is the same as those of the gap 22111, while the gap 22151 is located in the pad material layer 2215 and the gap 22111 is located in the OCA layer 2211.

Figure 5D:
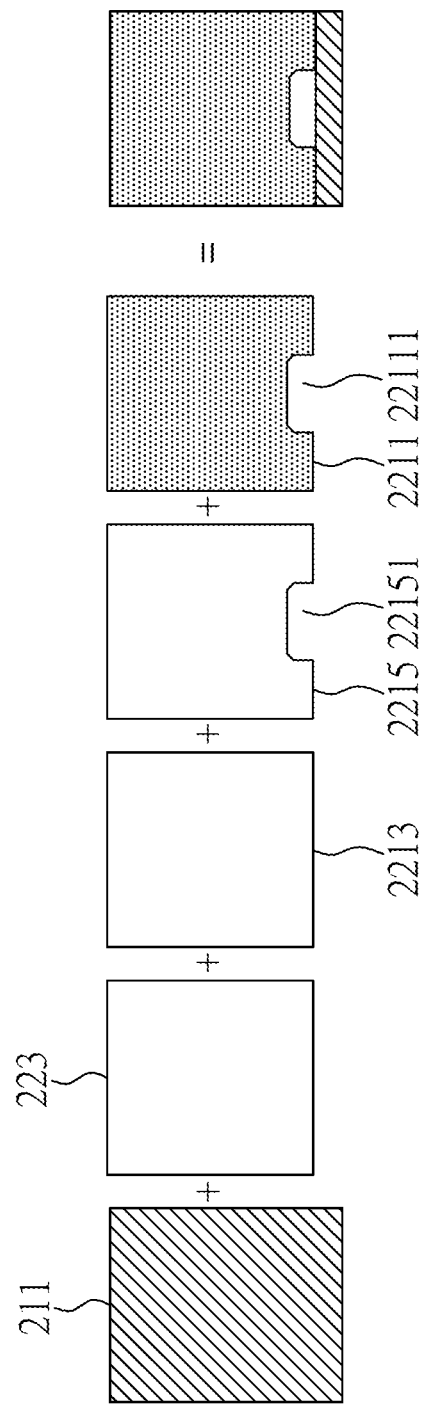
FIG. 5(D) schematically illustrates the thin film transistor array, color filter layer, polarizer layer, pad material layer and optical clear adhesive layer of the display device in accordance with the third embodiment of the present disclosure.

FIG. 5(D) schematically illustrates the thin film transistor array, color filter layer, polarizer layer, pad material layer and OCA layer of the display device in accordance with the third embodiment of the present disclosure. As shown, FIG. 5(D) is similar to FIG. 4(D) except that the pad material layer 2215 and the OCA layer 2211 are respectively provided with gaps 22151 and 22111 corresponding to the opening 231 to define the space 240.

Figure 6A:
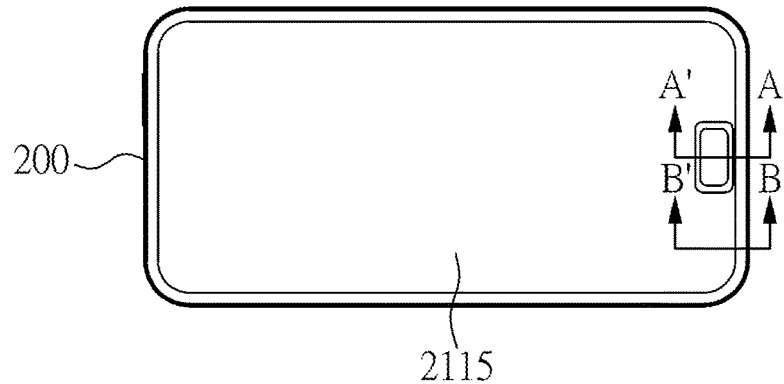
FIG. 6(A) is a schematic diagram of a high screen ratio display device with fingerprint identification in accordance with a fourth embodiment of the present disclosure.
Figure 6B:
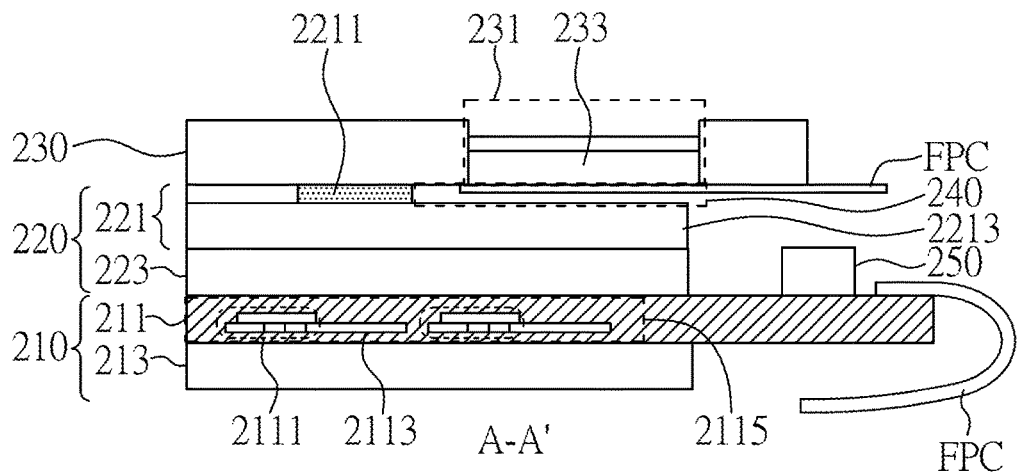
FIG. 6(B) is a cross-sectional view of the display device taken along the A-A' line in FIG. 6(A)
Figure 6C:
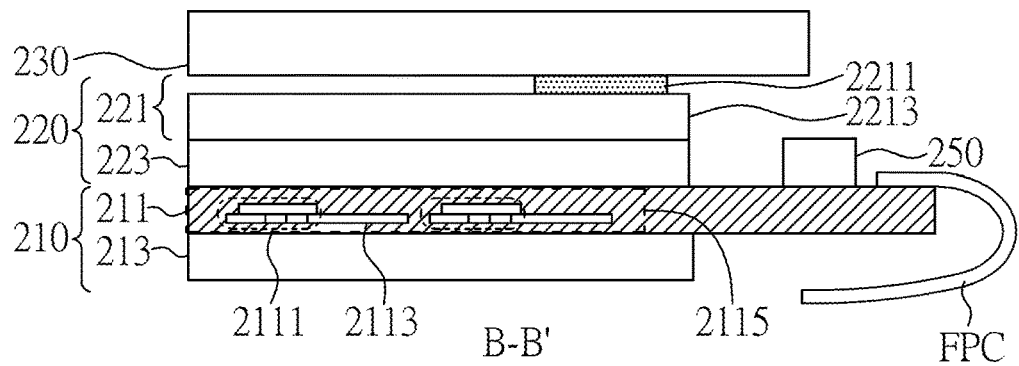
FIG. 6(C) is a cross-sectional view of the display device taken along the B-B' line in FIG. 6(A)

FIG. 6(A) is a schematic diagram of a high screen ratio display device with fingerprint identification in accordance with a fourth embodiment of the present disclosure. FIG. 6(B) is a cross-sectional view of the display device taken along the A-A' line in FIG. 6(A). FIG. 6(C) is a cross-sectional view of the display device taken along the B-B' line in FIG. 6(A). As shown, FIGS. 6(A) to 6(C) are similar to FIGS. 2(A) to 2(C) except that the OCA layer 2211 in FIG. 2(B) is a fully coated optical glue layer while the OCA layer 2211 in FIG. 6(B) is a partially coated optical glue layer, such as a mouth shape or hollow-square shape from top-view.

Figure 6D:
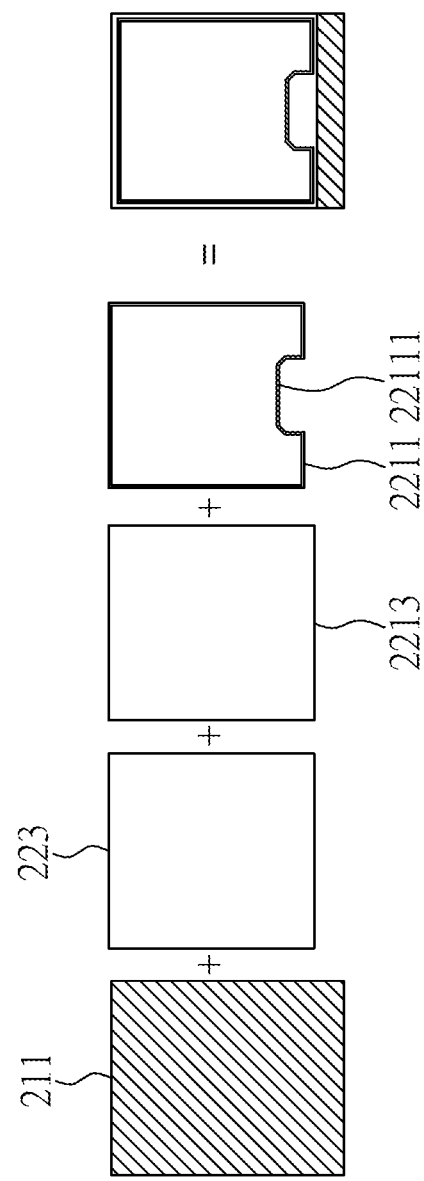
FIG. 6(D) schematically illustrates the thin film transistor array, color filter layer, polarizer layer and optical clear adhesive layer of the display device in accordance with the fourth embodiment of the present disclosure.

FIG. 6(D) schematically illustrates the thin film transistor array, color filter layer, polarizer layer and OCA layer of the display device in accordance with the fourth embodiment of the present disclosure. As shown, FIG. 6(D) is similar to FIG. 3 except that the OCA layer 2211 is the partially coated optical glue layer to define the space 240. Similar to the embodiment above, the optical glue layer is shaped in mouth or hollow-square from top-view.

In other embodiments, the color filter layer 223 may be provided with a gap corresponding to the opening 231 to define the space 240 for accommodating the fingerprint identification module 233.

Figure 7:
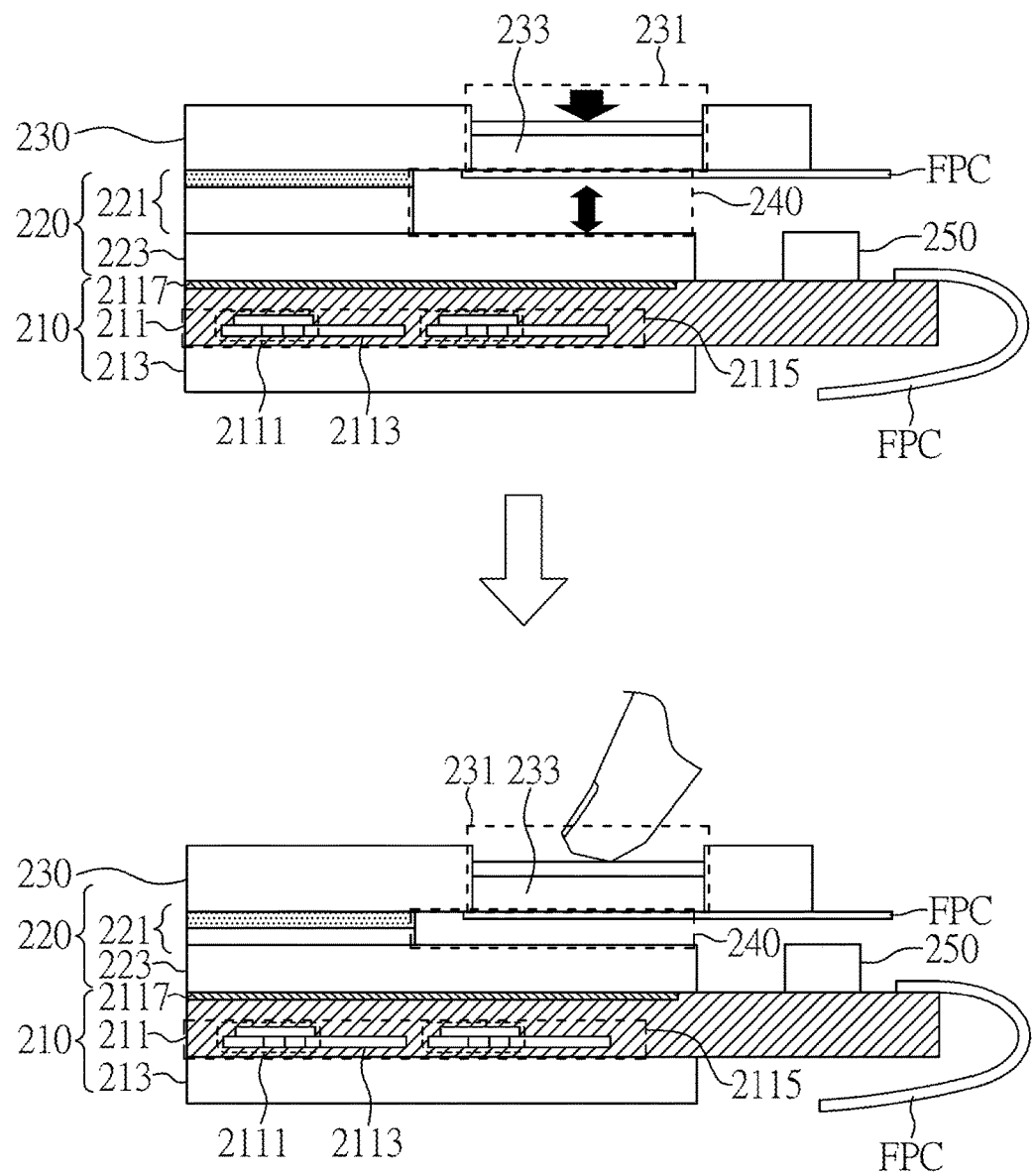
FIG. 7 is a schematic diagram of a high screen ratio display device with fingerprint identification in accordance with a fifth embodiment of the present disclosure.

FIG. 7 is a schematic diagram of a high screen ratio display device with fingerprint identification in accordance with a fifth embodiment of the present disclosure. As shown, FIG. 7 is similar to FIGS. 2(A) to 2(C) except that the thin film transistor array 211 has a plurality of sensing electrodes 2117 disposed corresponding to the opening 231 for sensing a change of the space 240 resulting from the fingerprint identification module 233 being pressed based on a capacitance sensing technique. Since the finger can be regarded as the ground, the change of the space 240 can be regarded as the distance change between the ground signal (the finger) and the sensing electrode 2117, such that a different voltage can be generated on the sensing electrode 2117, with which the force applied by the finger can be detected. By using the plurality of sensing electrodes 2117, the high screen ratio display device 200 can be provided with the function of a force sensor. In this embodiment, the capacitance sensing technique can be a self-capacitance sensing technique.

From the aforementioned description, it is known that the present disclosure can extend the active area 2115 of the display device 200 to the area indicated by the B-B' line, such that the screen ratio can be dramatically increased. With the present disclosure, the screen ratio of the display device 200 can be easily increased to exceed a ratio of 16 to 9. Furthermore, by disposing a plurality of sensing electrodes in an area of the thin film transistor array 211 that corresponds to the opening 231, the display device 200 can be provided with a function of force sensing. In one embodiment, the fingerprint identification module 233 can be configured with or operated with the function of an RGB LED breathing light, and the luminance of the breathing light can be automatically adjusted according to display content.

Although the present disclosure has been explained in relation to its preferred embodiment, it is to be understood that many other possible modifications and variations can be made without departing from the spirit and scope of the disclosure as hereinafter claimed.

What is claimed is:

1. A high screen ratio display device with fingerprint identification, comprising:
   a lower substrate having a thin film transistor array formed with a plurality of thin film transistors and corresponding capacitors to provide an active area;
   an upper substrate disposed on one side of the thin film transistor array and having an optical film layer; and
   a cover glass disposed on one side of the upper substrate and having an opening to accommodate a fingerprint identification module,
   wherein the opening at least partially overlaps the active area, and a space is defined between the opening and the thin film transistor array to accommodate a portion of the fingerprint identification module,
   wherein the thin film transistor array has a plurality of sensing electrodes disposed corresponding to the opening for sensing a change of the space resulting from the fingerprint identification module being pressed based on a self-capacitance sensing technique.

2. The high screen ratio display device with fingerprint identification as claimed in claim 1, wherein the optical film layer includes an optical clear adhesive layer and a polarizer layer.

3. The high screen ratio display device with fingerprint identification as claimed in claim 2, wherein the optical clear adhesive layer has a gap corresponding to the opening to define the space.

4. The high screen ratio display device with fingerprint identification as claimed in claim 2, wherein the polarizer layer has a gap corresponding to the opening to define the space.

5. The high screen ratio display device with fingerprint identification as claimed in claim 3, wherein the polarizer layer has a gap corresponding to the opening to define the space.

6. The high screen ratio display device with fingerprint identification as claimed in claim 3, wherein the optical film layer further includes a pad material layer having a gap corresponding to the opening to define the space.

7. The high screen ratio display device with fingerprint identification as claimed in claim 2, wherein the optical clear adhesive layer includes a fully coated optical glue layer or a partially coated optical glue layer comprising a mouth or hollow-square shape.

8. The high screen ratio display device with fingerprint identification as claimed in claim 4, further comprising:
   a color filter layer having a gap corresponding to the opening to define the space.

9. The high screen ratio display device with fingerprint identification as claimed in claim 1, wherein a display driving and touch detection integrated circuit is formed on the thin film transistor array.

10. The high screen ratio display device with fingerprint identification as claimed in claim 9, wherein the display drive and the touch detection integrated circuit is electrically connected to the thin film transistor array by chip on glass (COG) or chip on film (COF) technique.

11. The high screen ratio display device with fingerprint identification as claimed in claim 1, wherein the high screen ratio display device has a screen ratio greater than a ratio of 16 to 9.

12. The high screen ratio display device with fingerprint identification as claimed in claim 1, wherein the fingerprint identification module covers at least a portion of the active area.

* * * * *